(12) United States Patent
Wang et al.

(10) Patent No.: US 10,693,382 B2
(45) Date of Patent: Jun. 23, 2020

(54) MINIATURE FAST CHARGING AND DISCHARGING CIRCUIT

(71) Applicant: Xi'an Jiaotong University, Xi'an, Shaanxi (CN)

(72) Inventors: Laili Wang, Shaanxi (CN); Yang Chen, Shaanxi (CN); Mofan Tian, Shaanxi (CN)

(73) Assignee: Xi'an Jiaotong University, Xi'an (CN)

( * ) Notice: Subject to any disclaimer, the term of this patent is extended or adjusted under 35 U.S.C. 154(b) by 0 days.

(21) Appl. No.: 16/388,896

(22) Filed: Apr. 19, 2019

(65) Prior Publication Data
US 2019/0326825 A1 Oct. 24, 2019

(30) Foreign Application Priority Data

Apr. 19, 2018 (CN) .......................... 2018 1 0355503

(51) Int. Cl.
| | | |
|---|---|---|
| *H02M 3/335* | (2006.01) | |
| *H01L 41/09* | (2006.01) | |
| *H02J 7/00* | (2006.01) | |
| *H02M 1/00* | (2006.01) | |

(52) U.S. Cl.
CPC ........ *H02M 3/33584* (2013.01); *H01L 41/09* (2013.01); *H02J 7/0072* (2013.01); *H02M 2001/0009* (2013.01)

(58) Field of Classification Search
CPC ........... H02M 3/33584; H02M 3/3353; H02M 3/33592
See application file for complete search history.

(56) References Cited

U.S. PATENT DOCUMENTS

| | | | | | |
|---|---|---|---|---|---|
| 5,539,610 | A | * | 7/1996 | Williams ............. | H02H 11/003 307/10.7 |
| 6,031,747 | A | * | 2/2000 | Ilic ........................ | H02M 3/285 363/21.12 |
| 6,069,804 | A | * | 5/2000 | Ingman ................. | H02J 7/0068 363/124 |
| 6,590,791 | B1 | * | 7/2003 | Zhou ................ | H02M 3/33569 363/134 |

(Continued)

*Primary Examiner* — Thienvu V Tran
*Assistant Examiner* — Sisay G Tiku
(74) *Attorney, Agent, or Firm* — Wayne & Ken, LLC; Tony Hom

(57) ABSTRACT

A miniature fast charging and discharging circuit, including a power supply, a pre-stage boost auxiliary circuit, a bidirectional flyback circuit and an output capacitor. Input and output terminals of the pre-stage boost auxiliary circuit are respectively connected to the power supply and an input terminal of the bidirectional flyback circuit. The output capacitor is an output terminal of the bidirectional flyback circuit. The pre-stage boost auxiliary circuit includes a third switching MOSFET and a primary high-voltage storage capacitor connected in parallel with the power supply. When energy of the bidirectional flyback circuit reversely flows, the current cannot flow from the drain to the source, the current is stored in the primary high-voltage storage capacitor. Then, voltage of two ends of the primary high-voltage storage capacitor increases, and the charging time and the discharging time are simultaneously reduced, thereby accelerating the repeated charging and discharging speed of a dielectric elastomer.

11 Claims, 5 Drawing Sheets

(56) References Cited

U.S. PATENT DOCUMENTS

| | | | | |
|---|---|---|---|---|
| 8,537,572 B2 * | 9/2013 | Fornage | ............ | H02M 3/33507 363/21.12 |
| 9,537,406 B1 * | 1/2017 | Lin | ....................... | H02M 3/285 |
| 2012/0290145 A1 * | 11/2012 | Joshi | ....................... | H02J 3/385 700/298 |
| 2013/0241433 A1 * | 9/2013 | Ge | ..................... | H05B 33/0815 315/224 |
| 2017/0126028 A1 * | 5/2017 | Kang | .................... | H02J 7/0014 |

* cited by examiner

MINIATURE FAST CHARGING AND DISCHARGING CIRCUIT

CROSS-REFERENCE TO RELATED APPLICATIONS

This application claims the benefit of priority from Chinese Patent Application No. 201810355503.9, filed on Apr. 19, 2018. The content of the aforementioned application, including any intervening amendments thereto, is incorporated herein by reference in its entirety.

TECHNICAL FIELD

The present invention relates to power electronic technology for driving a dielectric elastomer, and in particular to a miniature fast charging and discharging circuit.

BACKGROUND OF THE INVENTION

In recent years, the breakthrough of AI technology on both of software and hardware leads to a new and beneficial development of robotics. Bionic flexible robots that have developed rapidly, compared to conventional robots with rigid structures, have some obvious advantages in underwater exploration, fire rescue and military.

A dielectric elastomer is capable of more than 100% deformation when an appropriate electric field is applied, and due to its characteristics of light weight, low noise, high efficiency, high strain and high flexibility, it is often used as artificial muscles in the bionic flexible robots. In order to extend to different applications, the dielectric elastomer has derived more excellent materials, such as electroactive materials with a high frequency response range and without pre-stretching. Wings of small birds have a high vibration frequency, for example, hummingbird's wings can vibrate at a frequency up to 80 Hz. Therefore, the dielectric elastomer of fast response makes it possible to achieve a small bionic bird.

There still many problems exist in the applications of the dielectric elastomer despite of its excellent properties. First, only less than 10% of electric field energy applied to the dielectric elastomer is converted to a mechanical energy in each conversion, and the remaining energy needs to be fed back to a power supply by a circuit or be directly dissipated by a resistor. The dissipation through the resistor will greatly reduce the efficiency of the circuit, thereby reducing the overall system efficiency. Second, in applications of a fast-responding dielectric elastomer, the power supply circuit is required to reach a sufficient charging and discharging speed. In a discontinuous conduction mode (DCM), the charging and discharging time of a bidirectional flyback topology are inversely proportional to the supply voltage and the peak current of the primary transformer. However, in practical applications, a lithium battery or a button battery is commonly used as a power source, which is boosted to a high voltage through a DC-DC circuit. Since the supply voltage and the peak current available are limited, the charging speed may be limited by the lower voltage and the current of charging. The cycle time of charging and discharging can be reduced by increasing turns ratio of the transformer, but it will greatly increase the size and design difficulty of the converter and increase voltage stress of the secondary MOSFET.

Therefore, in order to achieve the fast charging and discharging of dielectric elastomers, it is urgent to propose an improved bidirectional flyback circuit to increase the charging and discharging speed.

SUMMARY OF THE INVENTION

In order to overcome the above defects of the prior art, an object of the present invention is to provide a miniature fast charging and discharging circuit, which can be applied in an application of a high voltage and a low capacitive load, thereby realizing a fast charging and discharging using a low-voltage lithium battery.

The technical solutions of the present invention is described as follows.

A miniature fast charging and discharging circuit, including a power supply $V_{in}$, a pre-stage boost auxiliary circuit, a bidirectional flyback circuit and an output capacitor $C_{out}$. An input terminal of the pre-stage boost auxiliary circuit is connected to the power supply $V_{in}$, and an output terminal of the pre-stage boost auxiliary circuit is connected to an input terminal of the bidirectional flyback circuit. An output terminal of the bidirectional flyback circuit is connected to the output capacitor $C_{out}$.

The pre-stage boost auxiliary circuit includes a third switching MOSFET $Q_3$ connected in series with the power supply $V_{in}$ and a primary high-voltage storage capacitor $C_{HV}$ connected in parallel with the power supply $V_{in}$. A source of the third switching MOSFET $Q_3$ is connected to a cathode of the power supply $V_{in}$, and a drain of the third switching MOSFET $Q_3$ is connected to a cathode of the primary high-voltage storage capacitor $C_{HV}$ and the input terminal of the bidirectional flyback circuit. An anode of the power supply $V_{in}$ and an anode of the primary high-voltage storage capacitor $C_{HV}$ are connected to another input terminal of the bidirectional flyback circuit. When an energy in the bidirectional flyback circuit reversely flows, there is no conduction signal in the third switching MOSFET $Q_3$, and a current is stored in the primary high-voltage storage capacitor $C_{HV}$.

In an embodiment, the bidirectional flyback circuit includes a primary circuit provided with a first switching MOSFET $Q_1$, a secondary circuit provided with a second switching MOSFET $Q_2$ and a high-frequency flyback transformer. The bidirectional flyback circuit further includes a blocking diode $D_1$ connected in series with the second switching MOSFET $Q_2$ and an external flyback diode $D_2$ connected in parallel with the second switching MOSFET $Q_2$ and the blocking diode $D_1$. The output capacitor $C_{out}$ is provided at the secondary circuit.

One end of a primary winding of the high-frequency flyback transformer is connected to the drain of the third switching MOSFET $Q_3$, and the other end of the primary winding of the high-frequency flyback transformer is connected to a drain of the first switching MOSFET $Q_1$. A source of the first switching MOSFET $Q_1$ is connected to the anode of the power supply $V_{in}$.

One end of a secondary winding of the high-frequency flyback transformer is connected to a cathode of the output capacitor $C_{out}$, and the other end of the secondary winding of the high-frequency flyback transformer is connected to an anode of the blocking diode $D_1$ and a cathode of the external flyback diode $D_2$. A cathode of the blocking diode $D_1$ is connected to a drain of the second switching MOSFET $Q_2$, and a source of the second switching MOSFET $Q_2$ is connected to an anode of the external flyback diode $D_2$ and an anode of the output capacitor $C_{out}$. The anode of the power supply $V_{in}$ and the anode of the output capacitor $C_{out}$ are both grounded.

In an embodiment, during a charging time, the second switching MOSFET $Q_2$ is kept off, and the first switching MOSFET $Q_1$ is turned on and off according to a PWM waveform of an external control signal connected to a gate of the first switching MOSFET $Q_1$.

When the first switching MOSFET $Q_1$ is turned on, an excitation current $I_{Lm}$ of the primary winding of the high-frequency flyback transformer linearly increases, and the secondary winding of the high-frequency flyback transformer induces a reverse voltage. At this time, the external flyback diode $D_2$ is reversely turned off. There is no current in the secondary circuit, and the excitation current $I_{Lm}$ is limited to a primary peak value $I_{p\ peak}$. When the excitation current $I_{Lm}$ reaches the primary peak value $I_{p\ peak}$, the first switching MOSFET $Q_1$ is turned off, and an energy stored in an excitation inductor $L_m$ of the high-frequency flyback transformer is discharged according to a flow direction from the output capacitor $C_{out}$ to the external flyback diode $D_2$. At this time, the secondary winding of the high-frequency flyback transformer induces a forward voltage. A secondary current $I_s$ linearly decreases from a secondary peak value $I_{s\ peak}$, and a voltage of the output capacitor $C_{out}$ slowly increases. When the secondary current $I_s$ drops to zero, the first switching MOSFET $Q_1$ is turned on again, and a new cycle is restarted until the voltage of the output capacitor $C_{out}$ reaches a setting value.

In an embodiment, during a charging time, the charging time of the miniature fast charging and discharging circuit is calculated according to formula (1):

$$T_{ch} = n_o g \Delta t_p + \Delta t_{s1} + \sum_{n=2}^{n_o} \Delta t_s = \tag{1}$$

$$n_o g \frac{L_m I_{p\ peak}}{U_{in}} + \frac{1}{2}\sqrt{N^2 L_m C_{out}} + \sum_{n=2}^{n_o} \frac{NL_m}{\sqrt{n-1}\ g\sqrt{L_m/C_{out}}}$$

where $n_o$ is the switching cycle number for a charging process; N is the turns ratio of the high-frequency flyback transformer; and $U_{in}$ is the input voltage of the power supply $V_{in}$.

In an embodiment, during a discharging time, the first switching MOSFET $Q_1$ is kept off, and the second switching MOSFET $Q_2$ is turned on and off according to a PWM waveform of the control circuit.

When the second switching MOSFET $Q_2$ is turned on, the voltage of the output capacitor $C_{out}$ is applied to the secondary winding of the high-frequency flyback transformer, and the secondary current $I_s$ flowing through the secondary winding of the high-frequency flyback transformer linearly increases. At this time, the primary winding induces a reverse voltage. The first switching MOSFET $Q_1$ is kept off, and a parasitic diode in the first switching MOSFET $Q_1$ is kept in a reverse blocking state. There is no induced current in the primary circuit. When the external control signal connected to the gate of the first switching MOSFET $Q_1$ detects that a peak value of the secondary current $I_s$ of the high-frequency flyback transformer reaches the secondary peak value $I_{s\ peak}$, the second switching MOSFET $Q_2$ is turned off, and the primary winding induces a forward voltage. The energy stored in the high-frequency flyback transformer is discharged according to a flow direction from the first switching MOSFET $Q_1$, the excitation inductor $L_m$ to the primary high-voltage storage capacitor $C_{HV}$ in turn; and the excitation current of the primary winding linearly decreases from the the primary peak value $I_{p\ peak}$ until it is zero. At this time, the secondary switching MOSFET $Q_2$ is turned on again, and a new cycle is repeated until an output voltage of the output capacitor is reduced to zero.

In an embodiment, during a discharging time, the discharging time of the miniature fast charging and discharging circuit is calculated according to formula (2):

$$T_{disch} = \tag{2}$$

$$\sum_{n=1}^{n_{os}} N^2 L_m I_{s\ peak}/\sqrt{U_{aim}^2 - \frac{(n-1)N^2 L_m I_{s\ peak}^2}{C_{out}}} + n_{os} g \frac{L_m N I_{s\ peak}}{U_{in}}$$

where $n_{os}$ is the switching cycle number for a discharging process; N is the turns ratio of the high-frequency flyback transformer; and $U_{in}$ is the input voltage of the power supply $V_{in}$.

In an embodiment, the pre-stage boost auxiliary circuit further includes a discharging resistor $R_1$ which is arranged in parallel with the primary high-voltage storage capacitor $C_{HV}$.

In an embodiment, the third switching MOSFET Q3 is replaced with a diode to achieve a boost effect.

Compared to the prior art, the present invention has the following beneficial technical effects:

The present invention discloses a miniature fast charging and discharging circuit, including a power supply $V_{in}$, a pre-stage boost auxiliary circuit, a bidirectional flyback circuit and an output capacitor $C_{out}$. An input terminal of the pre-stage boost auxiliary circuit is connected to the power supply $V_{in}$, and an output terminal of the pre-stage boost auxiliary circuit is connected to an input terminal of the bidirectional flyback circuit. The output capacitor $C_{out}$ is an output terminal of the bidirectional flyback circuit. Due to the addition of the pre-stage boost auxiliary circuit, the present invention utilizes the characteristics of the bidirectional flyback circuit that the energy therein can reversely flow. In addition, the third switching MOSFET $Q_3$ and the primary high-voltage storage capacitor $C_{HV}$ are added. A source of the third switching MOSFET $Q_3$ is connected to a cathode of the power supply $V_{in}$, and a drain of the third switching MOSFET $Q_3$ is connected to a cathode of the primary high-voltage storage capacitor $C_{HV}$. When the energy of the bidirectional flyback circuit reversely flows, there is no conduction signal in the third switching MOSFET $Q_3$, and the current cannot flow from the drain to the source, so that the current is stored in the primary high-voltage storage capacitor $C_{HV}$. After the electric charge is stored in the primary high-voltage storage capacitor, voltage of two ends of the primary high-voltage storage capacitor $C_{HV}$ increases, and the charging time $T_{ch}$ and the discharging time $T_{disch}$ are simultaneously reduced, accelerating the repeated charging and discharging speed of the dielectric elastomer.

Further, the pre-stage boost auxiliary circuit further includes a discharging resistor $R_1$ which is arranged in parallel with the primary high-voltage storage capacitor $C_{HV}$. The discharging resistor $R_1$ has a large resistance and is used as a bleeder circuit of the pre-stage boost auxiliary circuit. It should be noted that the discharging resistor $R_1$ may be or may not be adopted according to the actual requirements.

DETAILED DESCRIPTION OF EMBODIMENTS

The invention is further described in detail with reference to the embodiments which are illustrative, and are not intended to limit the scope of the present invention.

Figure 1:
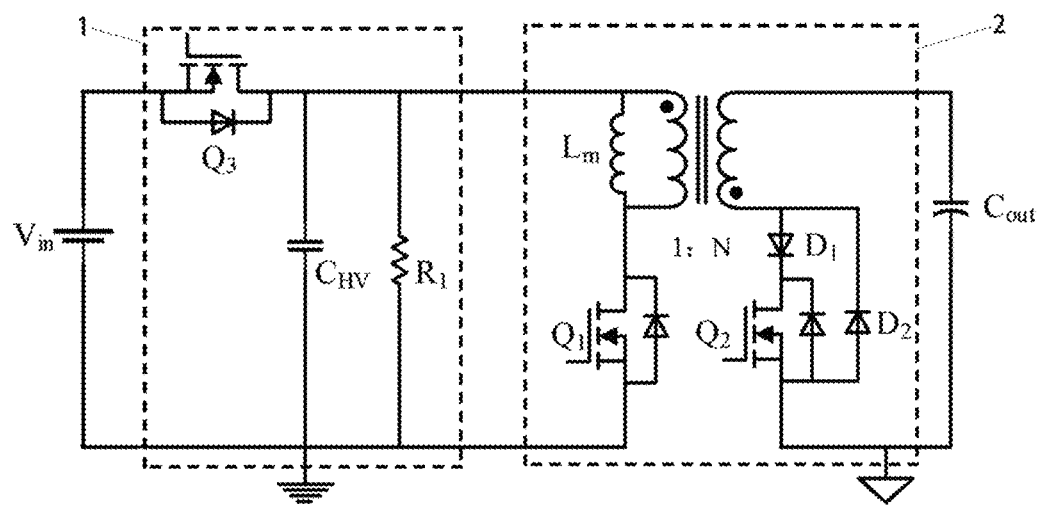
FIG. 1 is a schematic diagram of a miniature fast charging and discharging bidirectional flyback circuit.

As shown in FIG. 1, a schematic diagram of a miniature fast charging and discharging bidirectional flyback circuit is illustrated. The circuit includes a power supply $V_{in}$, a pre-stage boost auxiliary circuit 1, a bidirectional flyback circuit 2 and an output capacitor $C_{out}$. An input terminal of the pre-stage boost auxiliary circuit 1 is connected to the power supply $V_{in}$, and an output terminal of the pre-stage boost auxiliary circuit 1 is connected to an input terminal of the bidirectional flyback circuit 2. An output terminal of the bidirectional flyback circuit 2 is connected to the output capacitor $C_{out}$. The bidirectional flyback circuit 2 works in a boundary conduction mode (BCM).

The pre-stage boost auxiliary circuit 1 includes a third switching MOSFET $Q_3$ connected in series with the power supply $V_{in}$ and a primary high-voltage storage capacitor $C_{HV}$ connected in parallel with the power supply $V_{in}$. A source of the third switching MOSFET $Q_3$ is connected to a cathode of the power supply $V_{in}$, and a drain of the third switching MOSFET $Q_3$ is connected to a cathode of the primary high-voltage storage capacitor $C_{HV}$ and the input terminal of the bidirectional flyback circuit 2. An anode of the power supply $V_{in}$ and an anode of the primary high-voltage storage capacitor $C_{HV}$ are connected to another input terminal of the bidirectional flyback circuit 2. When an energy of the bidirectional flyback circuit 2 reversely flows, there is no conduction signal in the third switching MOSFET $Q_3$, and a current is stored in the primary high-voltage storage capacitor $C_{HV}$.

The bidirectional flyback circuit 2 includes a primary circuit provided with a first switching MOSFET $Q_1$, a secondary circuit provided with a second switching MOSFET $Q_2$ and a high-frequency flyback transformer. The bidirectional flyback circuit 2 further includes a blocking diode $D_1$ connected in series with the second switching MOSFET $Q_2$ and an external flyback diode $D_2$ connected in parallel with the second switching MOSFET $Q_2$ and the blocking diode $D_1$. The output capacitor $C_{out}$ is provided in the secondary circuit. One end of a primary winding of the high-frequency flyback transformer is connected to the drain of the third switching MOSFET $Q_3$, and the other end is connected to a drain of the first switching MOSFET $Q_1$. A source of the first switching MOSFET $Q_1$ is connected to the anode of the power supply $V_{in}$.

One end of a secondary winding of the high-frequency flyback transformer is connected to a cathode of the output capacitor $C_{out}$, and the other end of the secondary winding of the high-frequency flyback transformer is connected to an anode of the blocking diode $D_1$ and a cathode of the external flyback diode $D_2$. A cathode of the blocking diode $D_1$ is connected to a drain of the second switching MOSFET $Q_2$, and a source of the second switching MOSFET $Q_2$ is connected to an anode of the external flyback diode $D_2$ and an anode of the output capacitor $C_{out}$. The anode of the power supply $V_{in}$ and the anode of the output capacitor $C_{out}$ are both grounded.

The external flyback diode $D_2$ is adopted to replace a parasitic diode of the second switching MOSFET which has a poor performance, achieving a higher work efficiency. Since a voltage drop of the external flyback diode $D_2$ is the same as a voltage drop of the parasitic diode of the second switching MOSFET, the blocking diode $D_1$ is required to block the parasitic diode.

In an embodiment, the pre-stage boost auxiliary circuit 1 further includes a resistor $R_1$ which is a discharge resistor and has a high resistance. It may be or may not be adopted according to the actual requirements.

When driving a dielectric elastomer, a common bidirectional flyback circuit 2 feeds back the electric energy of the load capacitor that is not converted into mechanical energy to the power supply. In the present invention, due to the addition of the pre-stage boost auxiliary circuit 1, the energy fed back is blocked by the third switching MOSFET $Q_3$, and is stored in the primary high-voltage storage capacitor $C_{HV}$. By selecting primary high-voltage storage capacitors $C_{HV}$ with different capacitance, high voltages (relative to the voltage of the lithium battery) with different amplitudes can be obtained in the primary winding of the high-frequency flyback transformer, and the obtained high voltages can significantly shorten the discharging time and effectively increase the charging speed of a next charging cycle. During each charging cycle, due to the loss of mechanical energy, some energy has to be transferred from the power supply $V_{in}$ to the output, so that the third switching MOSFET $Q_3$ needs to be turned on at a specified time of each charging cycle.

In an embodiment, the third switching MOSFET $Q_3$ may be replaced with a diode to realize the same boost effect.

The principle of the fast charging and discharging of the circuit will be described in detail below with reference to a drive signal and a work waveform in FIGS. 2 and 3.

Figure 2:
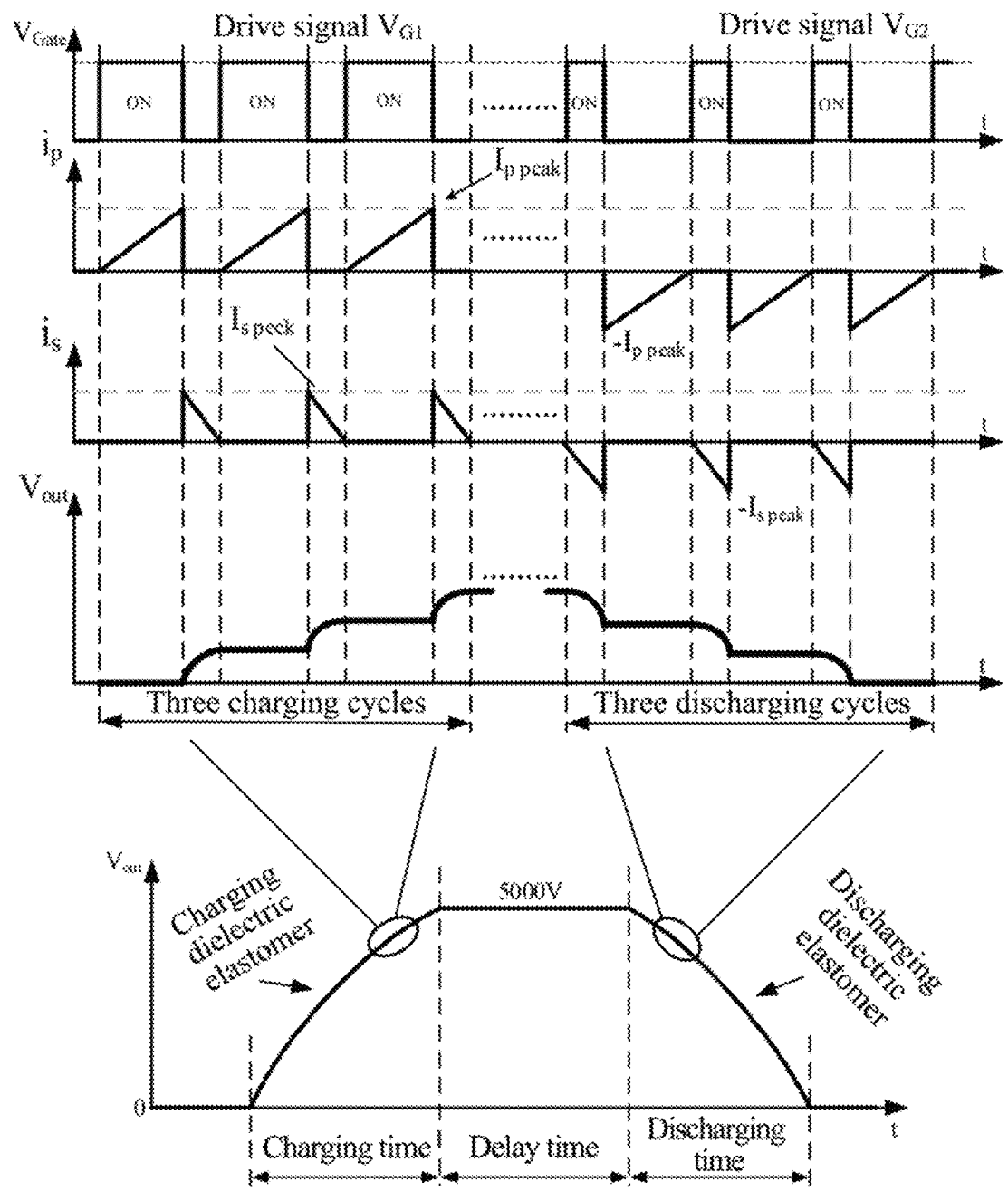
FIG. 2 is a schematic diagram showing a drive signal and a work waveform.
Figure 3:
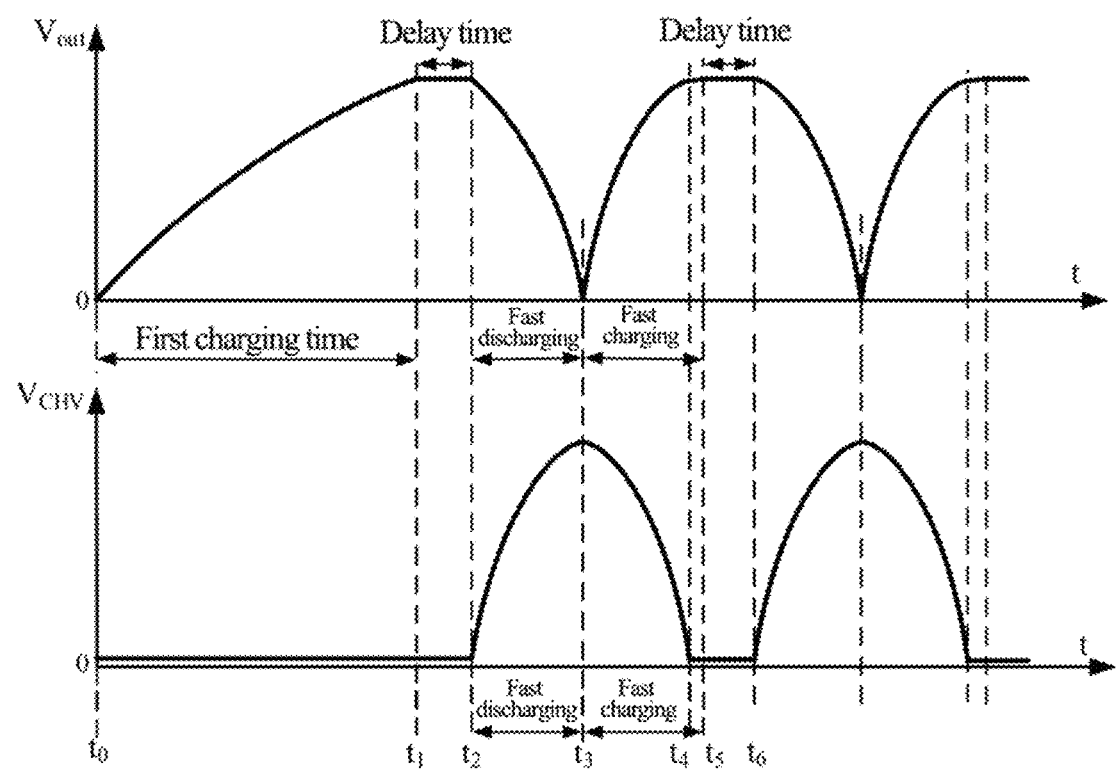
FIG. 3 is a schematic diagram of the work waveform during fast charging and discharging.

As shown in FIG. 2, during the charging time, the second switching MOSFET $Q_2$ is kept off. In FIG. 1, the first switching MOSFET $Q_1$ is turned on and off according to a PWM waveform of an external control signal connected to a gate of the first switching MOSFET $Q_1$. When the first switching MOSFET $Q_1$ is turned on, an excitation current km of the primary winding of the high-frequency flyback transformer linearly increases, and the secondary winding of the high-frequency flyback transformer induces a reverse voltage. At this time, the external flyback diode $D_2$ is reversely turned off. There is no current in the secondary circuit, and the excitation current $I_{Lm}$ is limited to a primary peak value $I_{p\ peak}$. When the excitation current $I_{Lm}$ reaches the primary peak value $I_{p\ peak}$, the first switching MOSFET $Q_1$ is turned off, and an energy stored in an excitation inductor $L_m$ of the high-frequency flyback transformer is discharged according to a flow direction from the output capacitor $C_{out}$ to the external flyback diode $D_2$. At this time, the secondary winding of the high-frequency flyback transformer induces a forward voltage. A secondary current $I_s$ linearly decreases from a secondary peak value $I_{s\ peak}$, and a voltage of the output capacitor $C_{out}$ slowly increases. When the secondary current $I_s$ drops to zero, the first switching MOSFET $Q_1$ is turned on again, and a new cycle is restarted until the voltage of the output capacitor $C_{out}$ reaches a setting value.

The first switching MOSFET $Q_1$ is kept off, and the second switching MOSFET $Q_2$ is turned on and off according to a PWM waveform of the control circuit. When the second switching MOSFET $Q_2$ is turned on, the voltage of the output capacitor $C_{out}$ is applied to the secondary winding of the high-frequency flyback transformer, and the secondary current Is flowing through the secondary winding of the high-frequency flyback transformer linearly increases, and the primary winding is induced to have a reverse voltage. The first switching MOSFET $Q_1$ is kept off, and the parasitic diode in the first switching MOSFET $Q_1$ has a reverse current and is kept in a blocking state. There is no induced current in the primary circuit. When the external control signal connected to a gate of the first switching MOSFET $Q_1$ detects that the peak value of the secondary current $I_s$ of the high-frequency flyback transformer reaches the secondary peak value $I_{s\_peak}$, the second switching MOSFET $Q_2$ is turned off, and the primary winding is induced to have a forward voltage. The energy stored in the high-frequency flyback transformer is discharged according to a flow direction from the primary switching MOSFET $Q_1$, the excitation inductor $L_m$ to the primary high-voltage storage capacitor $C_{HV}$ in turn, and the excitation current of the primary winding linearly decreases from the primary peak value $I_{p\_peak}$ until it is zero. At this time, the secondary switching MOSFET $Q_2$ is turned on again, and a new cycle is repeated until the voltage of the output capacitor is reduced to zero.

The charging time of the bidirectional flyback circuit is calculated according to formula (1):

$$T_{ch} = n_o g \Delta t_p + \Delta t_{s1} + \sum_{n=2}^{n_o} \Delta t_s = n_o g \frac{L_m I_{p\ peak}}{U_{in}} + \frac{1}{2}\sqrt{N^2 L_m C_{out}} + \sum_{n=2}^{n_o} \frac{NL_m}{\sqrt{n-1}\ g\sqrt{L_m/C_{out}}} \quad (1)$$

where $n_o$ is the switching cycle number for a charging process; N is the turns ratio of the high-frequency flyback transformer; and $U_{in}$ is the input voltage of the power supply $V_{in}$.

The recharging time of the bidirectional flyback circuit is calculated according to formula (2):

$$T_{disch} = \sum_{n=1}^{n_{os}} N^2 L_m I_{s\ peak}/\sqrt{U_{aim}^2 - \frac{(n-1)N^2 L_m I_{s\ peak}^2}{C_{out}}} + n_{os} g \frac{L_m N I_{s\ peak}}{U_{in}} \quad (2)$$

where $n_{os}$ is the switching cycle number for a discharging process; N is the turns ratio of the high-frequency flyback transformer; and $U_{in}$ is the input voltage of the power supply $V_{in}$.

After electric charge is stored in the primary high-voltage storage capacitor, voltage of two ends of the primary high-voltage storage capacitor $C_{HV}$ increases, and the charging time $T_{ch}$ and the discharging time $T_{disch}$ are simultaneously reduced, thereby accelerating the repeated charging and discharging speed of the dielectric elastomer.

As shown in FIGS. 4a to 4d, equivalent circuit diagrams of different time periods are illustrated, and the specific working status is as follows.

Figure 4A:
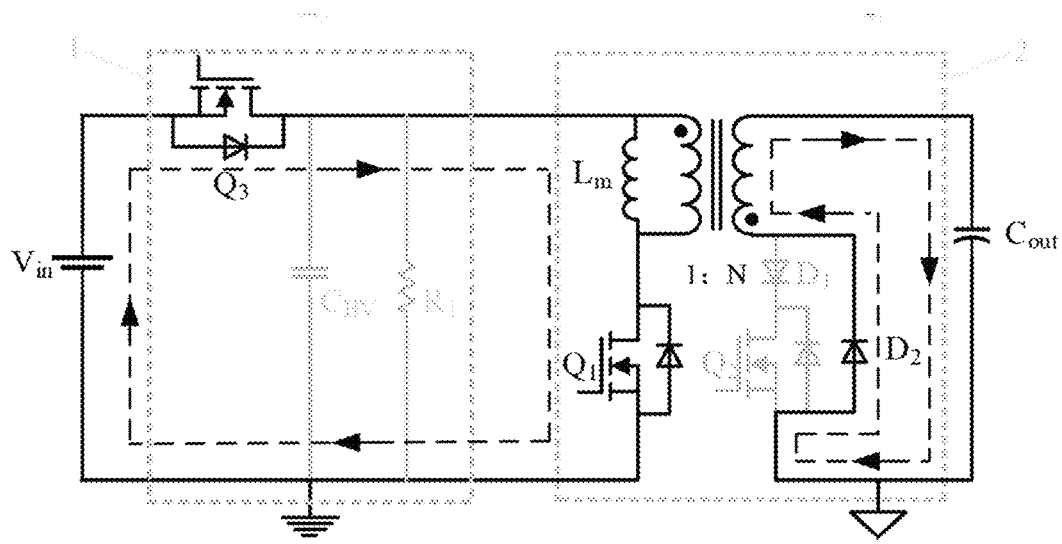
FIG. 4a is an equivalent circuit diagram of the miniature fast charging and discharging circuit in periods of $t_0$-$t_1$ and $t_1$-$t_2$.

Period of $t_0$-$t_1$: as shown in FIG. 4a, when the second switching MOSFET $Q_2$ is kept off and the first switching MOSFET $Q_1$ is turned on, the third switching MOSFET $Q_3$ is turned on, and the flow direction of the current is from $V_{in}$, $Q_3$, $L_m$, $Q_1$ to $V_{in}$ in turn, and the energy at this moment is stored in the excitation inductor $L_m$. When the first switching MOSFET $Q_1$ is turned off, the flow direction of the current in the secondary circuit is from $L_{m\_s}$, $C_{out}$, $D_2$ to $L_{m\_s}$ in turn. At this moment, $L_{m\_s}$ is an inductor when the excitation current of the primary winding is equivalent to that of the secondary winding. The energy of the primary and secondary circuits both flow clockwise. The first charging process is as same as the common bidirectional flyback circuit 2.

Period of $t_1$-$t_2$: at this time, the circuit is kept in a high voltage for a period of time, which is called a delay time. In practical operation, a delay time value determines the working state of the bidirectional flyback circuit in the delay time. When the delay time is short, the voltage drop caused by the load equivalent resistor can be ignored, and the bidirectional flyback circuit does not work during the delay time. However, when a delay time is long, in order to keep the voltage of the output capacitor, the bidirectional flyback circuit is set to stably output voltage within the delay time. Now the delay time is assumed to be very short, and the bidirectional flyback circuit does not work during this period.

Figure 4B:
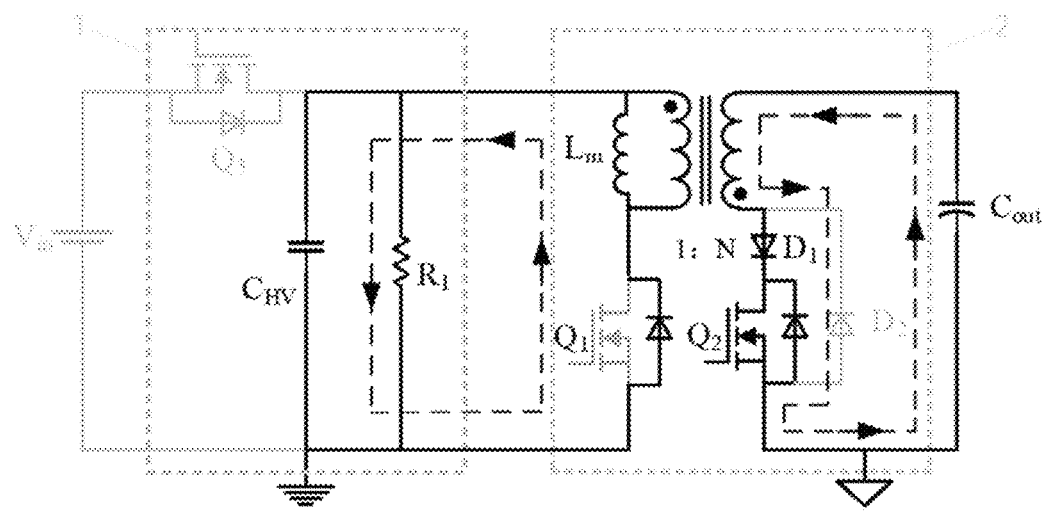
FIG. 4b is an equivalent circuit diagram of the miniature fast charging and discharging circuit in a period of $t_2$-$t_3$.

Period of $t_2$-$t_3$: as shown in FIG. 4b, the energy of the bidirectional flyback circuit 2 reversely flows, and the output capacitor $C_{out}$ starts to discharge. The third switching MOSFET $Q_3$ in the pre-stage boost auxiliary circuit is kept off, and the second switching MOSFET $Q_2$ is turned on and off according to the PWM waveform. When the second switching MOSFET $Q_2$ is turned on, the flow direction of current of the secondary circuit is from $C_{out}$, $L_{m\_s}$, $D_1$, $Q_2$ to $C_{out}$ in turn, and the energy is stored in the high-frequency flyback transformer. When the second switching MOSFET $Q_2$ is turned off, the first switching MOSFET $Q_1$ adopts a wide bandgap device, which can flyback with the parasitic diode thereof, and at this moment, the flow direction of the current is from $L_m$, $C_{HV}$, $Q_1$ to $L_m$ in turn. The resistance of the discharging resistor R1 is defined infinite. After the mechanical energy is converted, the remaining electric field energy of the dielectric elastomer is totally transferred to the primary high-voltage storage capacitor $C_{HV}$ without considering the energy loss. Different capacitance values are selected according to an energy storage formula of the capacitor $W=\frac{1}{2}C_{HV}U^2$. After the voltage of two ends of the output capacitor $C_{out}$ is completely reduced to zero, different voltage peaks can be obtained in the primary winding of the high-frequency flyback transformer.

Figure 4C:
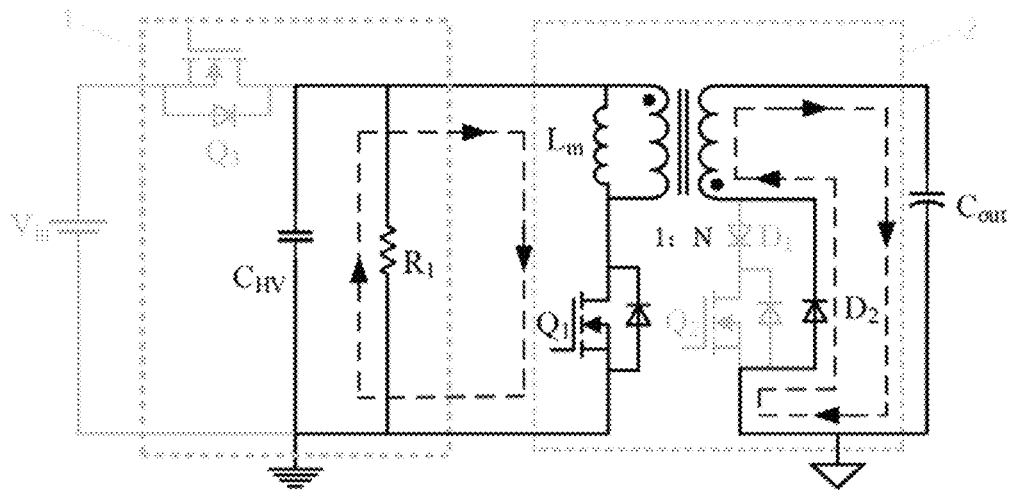
FIG. 4c is an equivalent circuit diagram of the miniature fast charging and discharging circuit in a period of $t_3$-$t_4$.

Period of $t_3$-$t_4$: as shown in FIG. 4c, the primary high-voltage storage capacitor $C_{HV}$ with a proper capacitance can obtain a higher voltage in the primary circuit without damaging the control circuit and the insulation. According to the calculation formula of the discharging time of the bidirectional flyback circuit, the charging time is greatly reduced. In a charging process from this stage to next cycle, when the third switching MOSFET $Q_3$ of the pre-stage boost auxiliary circuit 1 is kept off and the first switching MOSFET $Q_1$ is turned on, the flow direction of the primary current is from $C_{HV}$, $L_m$, $Q_1$ to $C_{HV}$ in turn. When the first switching MOSFET $Q_1$ is turned off, the flow direction of the secondary current is from $L_{m\_s}$, $C_{out}$, $D_2$ to $L_{m\_s}$ in turn, where $L_{m\_s}$ is an inductor when the excitation current of the primary winding is equivalent to that of the secondary winding. The energy of the primary and secondary circuits both flow clockwise. The voltage of the two ends of the output capacitor $C_{out}$ gradually increases, and the voltage of the primary high-voltage storage capacitor $C_{HV}$ gradually decreases.

Figure 4D:
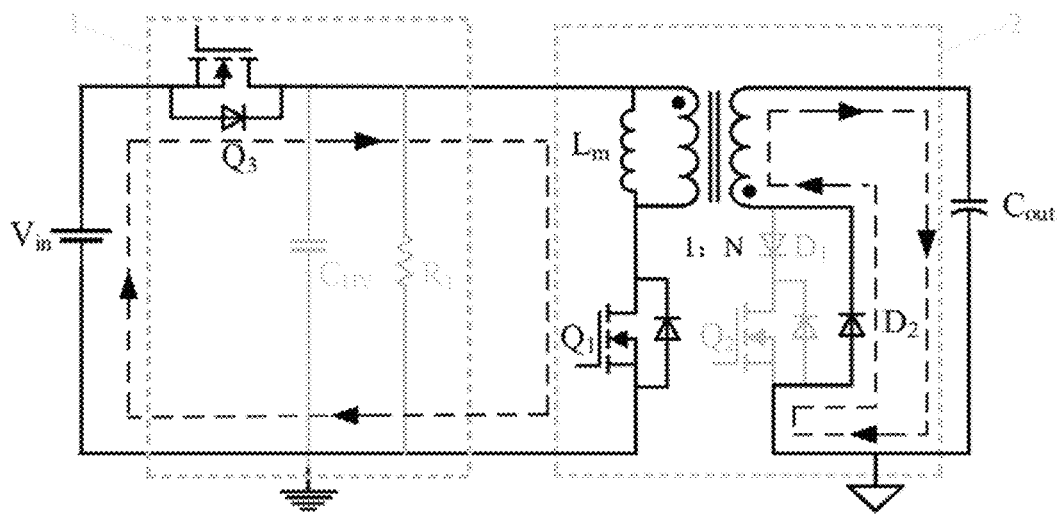
FIG. 4d is an equivalent circuit diagram of the miniature fast charging and discharging circuit in a period of $t_4$-$t_5$.

Period of $t_4$-$t_5$: as shown in FIG. 4d, the output capacitor $C_{out}$ does not reach a target voltage, and the voltage of the primary high-voltage storage capacitor $C_{HV}$ is reduced to the input voltage of the power supply $V_{in}$, which can be collected by a sensor. When the voltage of the primary high-voltage storage capacitor $C_{HV}$ is reduced to the input voltage of the power supply $V_{in}$, the third switching MOSFET $Q_3$ is turned on, so the energy of this period is from the charging voltage source. The equivalent circuit diagram of this period is the same as that of $t_1$-$t_2$ period. At the moment of $t_5$, the voltage of the output capacitor $C_{out}$ reaches the target voltage. The delay time is entered, and the work of the bidirectional flyback circuit is suspended.

It should be particularly noted that the bidirectional flyback circuit of the present invention can also be changed to other bidirectional circuit topologies. Any topologies that can speed up the charging speed by increasing the voltage of the primary circuit may be used.

The embodiments of the invention is described above with reference to the accompanying drawings, which is not intended to limit the scope of the present invention. Various modifications and variations made by those skilled in the art without departing from the principles of the invention are still within the scope of the invention.

What is claimed is:

1. A miniature fast charging and discharging circuit, comprising:
   a power supply $V_{in}$,
   a pre-stage boost auxiliary circuit,
   a bidirectional flyback circuit, and
   an output capacitor $C_{out}$;
   wherein:
   an input terminal of the pre-stage boost auxiliary circuit is connected to the power supply $V_{in}$, and an output terminal of the pre-stage boost auxiliary circuit is connected to an input terminal of the bidirectional flyback circuit; an output terminal of the bidirectional flyback circuit is connected to the output capacitor $C_{out}$;
   the pre-stage boost auxiliary circuit comprises a third switching MOSFET $Q_3$ connected in series with the power supply $V_{in}$, and a primary high-voltage storage capacitor $C_{HV}$ connected in parallel with the power supply $V_{in}$; a source of the third switching MOSFET $Q_3$ is connected to a cathode of the power supply $V_{in}$, and a drain of the third switching MOSFET $Q_3$ is connected to a cathode of the primary high-voltage storage capacitor $C_{HV}$ and the input terminal of the bidirectional flyback circuit; an anode of the power supply $V_{in}$ and an anode of the primary high-voltage storage capacitor $C_{HV}$ are connected to another input terminal of the bidirectional flyback circuit; when an energy of the bidirectional flyback circuit reversely flows, there is no conduction signal in the third switching MOSFET $Q_3$, and a current is stored in the primary high-voltage storage capacitor $C_{HV}$;
   wherein the bidirectional flyback circuit comprises a primary circuit provided with a first switching MOSFET $Q_1$, a secondary circuit provided with a second switching MOSFET $Q_2$ and a high-frequency flyback transformer; the bidirectional flyback circuit further comprises a blocking diode $D_1$ connected in series with the second switching MOSFET $Q_2$ and an external flyback diode $D_2$ connected in parallel with the second switching MOSFET $Q_2$ and the blocking diode $D_1$; the output capacitor $C_{out}$ is provided in the secondary circuit;
   one end of a primary winding of the high-frequency flyback transformer is connected to the drain of the third switching MOSFET $Q_3$, and the other end of the primary winding of the high-frequency flyback transformer is connected to a drain of the first switching MOSFET $Q_1$; a source of the first switching MOSFET $Q_1$ is connected to the anode of the power supply $V_{in}$;
   one end of a secondary winding of the high-frequency flyback transformer is connected to a cathode of the output capacitor $C_{out}$, and the other end of the secondary winding of the high-frequency flyback transformer is connected to an anode of the blocking diode $D_1$ and a cathode of the external flyback diode $D_2$; a cathode of the blocking diode $D_1$ is connected to a drain of the second switching MOSFET $Q_2$, and a source of the second switching MOSFET $Q_2$ is connected to an anode of the external flyback diode $D_2$ and an anode of the output capacitor $C_{out}$; the anode of the power supply $V_{in}$ and the anode of the output capacitor $C_{out}$ are both grounded.

2. The miniature fast charging and discharging circuit of claim 1, wherein, during a charging time, the second switching MOSFET $Q_2$ is kept off, and the first switching MOSFET $Q_1$ is turned on and off according to a PWM waveform of an external control signal connected to a gate of the first switching MOSFET $Q_1$;
   when the first switching MOSFET $Q_1$ is turned on, an excitation current $I_{Lm}$ of the primary winding of the high-frequency flyback transformer linearly increases, and the secondary winding of the high-frequency flyback transformer induces a reverse voltage; at this time, the external flyback diode $D_2$ is reversely turned off; there is no current in the secondary circuit, and the excitation current $I_{Lm}$ is limited to a primary peak value $I_{p\_peak}$; when the excitation current $I_{Lm}$ reaches the primary peak value $I_{p\_peak}$, the first switching MOSFET $Q_1$ is turned off, and an energy stored in an excitation inductor $L_m$ of the high-frequency flyback transformer is discharged according to a flow direction from the output capacitor $C_{out}$ to the external flyback diode $D_2$; at this time, the secondary winding of the high-frequency flyback transformer induces a forward voltage; a secondary current $I_s$ linearly decreases from a secondary peak value $I_{s\_peak}$, and a voltage of the output capacitor $C_{out}$ slowly increases; when the secondary current $I_s$ drops to zero, the first switching MOSFET $Q_1$ is turned on again, and a new cycle is restarted until the voltage of the output capacitor $C_{out}$ reaches a setting value.

3. The miniature fast charging and discharging circuit of claim 2, wherein during the charging time, the charging time of the miniature fast charging and discharging circuit is calculated according to formula (1):

$$T_{ch} = n_o g \Delta t_p + \Delta t_{s1} + \sum_{n=2}^{n_o} \Delta t_s = \qquad (1)$$

$$n_o g \frac{L_m I_{p\,peak}}{U_{in}} + \frac{1}{2}\sqrt{N^2 L_m C_{out}} + \sum_{n=2}^{n_o} \frac{N L_m}{\sqrt{n-1}\, g \sqrt{L_m/C_{out}}}$$

wherein $n_o$ is a switching cycle number for a charging process; N is a turns ratio of the high-frequency flyback transformer; and $U_{in}$ is a input voltage of the power supply $V_{in}$.

4. The miniature fast charging and discharging circuit of claim 3, wherein the pre-stage boost auxiliary circuit further comprises a discharging resistor $R_1$ arranged in parallel with the primary high-voltage storage capacitor $C_{HV}$.

5. The miniature fast charging and discharging circuit of claim 2, wherein the pre-stage boost auxiliary circuit further comprises a discharging resistor $R_1$ arranged in parallel with the primary high-voltage storage capacitor $C_{HV}$.

6. The miniature fast charging and discharging circuit of claim 1, wherein during a discharging time, the first switching MOSFET $Q_1$ is kept off, and the second switching MOSFET $Q_2$ is turned on and off according to a PWM waveform of the control circuit;

when the second switching MOSFET $Q_2$ is turned on, the voltage of the output capacitor $C_{out}$ is applied to the secondary winding of the high-frequency flyback transformer, and the secondary current $I_s$ flowing through the secondary winding of the high-frequency flyback transformer linearly increases; at this time, the primary winding induces a reverse voltage; the first switching MOSFET $Q_1$ is kept off, and a parasitic diode in the first switching MOSFET $Q_1$ is kept in a reverse blocking state; there is no induced current in the primary circuit; when the external control signal connected to a gate of the first switching MOSFET $Q_1$ detects that a peak value of a secondary current $I_s$ of the high-frequency flyback transformer reaches a secondary peak value $I_{s\ peak}$, the second switching MOSFET $Q_2$ is turned off, and the primary wingding induces a forward voltage; energy stored in the high-frequency flyback transformer is discharged according to a flow direction from the first switching MOSFET $Q_1$, an excitation inductor $L_m$ to the primary high-voltage storage capacitor $C_{HV}$ in turn; and an excitation current of the primary winding linearly decreases from a primary peak value $I_{p\ peak}$ until it is zero; at this time, the secondary switching MOSFET $Q_2$ is turned on again, and a new cycle is repeated until an output voltage of the output capacitor is reduced to zero.

7. The miniature fast charging and discharging circuit of claim 6, wherein during the discharging time, the discharging time of the miniature fast charging and discharging circuit is calculated according to formula (2):

$$T_{disch} = \sum_{n=1}^{n_{os}} N^2 L_m I_{s\,peak} / \sqrt{U_{aim}^2 - \frac{(n-1)N^2 L_m I_{s\,peak}^2}{C_{out}}} + n_{os} g \frac{L_m N I_{s\,peak}}{U_{in}} \quad (2)$$

wherein $n_{os}$ is a switching cycle number required for a discharging process; N is a turns ratio of the high-frequency flyback transformer; and $U_{in}$ is a input voltage of the power supply $V_{in}$.

8. The miniature fast charging and discharging circuit of claim 7, wherein the pre-stage boost auxiliary circuit further comprises a discharging resistor $R_1$ arranged in parallel with the primary high-voltage storage capacitor $C_{HV}$.

9. The miniature fast charging and discharging circuit of claim 6, wherein the pre-stage boost auxiliary circuit further comprises a discharging resistor $R_1$ arranged in parallel with the primary high-voltage storage capacitor $C_{HV}$.

10. The miniature fast charging and discharging circuit of claim 1, wherein the pre-stage boost auxiliary circuit further comprises a discharging resistor $R_1$ arranged in parallel with the primary high-voltage storage capacitor $C_{HV}$.

11. The miniature fast charging and discharging circuit of claim 1, wherein the pre-stage boost auxiliary circuit further comprises a discharging resistor $R_1$ arranged in parallel with the primary high-voltage storage capacitor $C_{HV}$.

* * * * *